(12) United States Patent
Vilas Boas et al.

(10) Patent No.: US 8,330,526 B2
(45) Date of Patent: Dec. 11, 2012

(54) LOW VOLTAGE DETECTOR

(75) Inventors: Andre Luis Vilas Boas, Campinas (BR); Alfredo Olmos, Austin, TX (US); Fabio de Lacerda, Niteroi (BR); Edgar Mauricio Camacho Galeano, Campinas (BR)

(73) Assignee: Freescale Semiconductor, Inc., Austin, TX (US)

( * ) Notice: Subject to any disclaimer, the term of this patent is extended or adjusted under 35 U.S.C. 154(b) by 137 days.

(21) Appl. No.: 12/836,997

(22) Filed: Jul. 15, 2010

(65) Prior Publication Data

US 2012/0013365 A1 Jan. 19, 2012

(51) Int. Cl.
*H01L 35/00* (2006.01)
*H03K 5/22* (2006.01)

(52) U.S. Cl. ............................... 327/512; 327/72; 327/83
(58) Field of Classification Search ..................... 327/72, 327/512
See application file for complete search history.

(56) References Cited

U.S. PATENT DOCUMENTS

| | | | |
|---|---|---|---|
| 5,070,295 A | 12/1991 | Morigami | |
| 5,196,833 A | 3/1993 | Kemp | |
| 5,847,586 A | 12/1998 | Burstein et al. | |
| 7,525,353 B2 | 4/2009 | Wadhwa et al. | |
| 7,579,898 B2 * | 8/2009 | Soldera et al. | 327/512 |
| 7,612,588 B2 | 11/2009 | Kimura | |
| 2003/0122590 A1 | 7/2003 | O | |
| 2003/0227306 A1 | 12/2003 | Di Iorio | |
| 2004/0093531 A1 * | 5/2004 | Espinor et al. | 713/340 |
| 2008/0061863 A1 * | 3/2008 | De Barros Soldera et al. | 327/512 |
| 2011/0095789 A1 * | 4/2011 | Tang et al. | 327/72 |

OTHER PUBLICATIONS

Alfredo Olmos, et al., "An Ultra Low-Power Low-Voltage Programmable Temperature Detection Circuit", ISCAS 2011, ISBN 978-1-4244-9472-9, May 2011, pp. 2525-2528, IEEE, US.
Alfredo Olmos, et al., "A Sub-1V Low Power Temperature Compensated Current Reference", ISCAS 2007, E-ISBN 1-4244-0921-7, Jun. 2007, pp. 2164-2167, IEEE, US.
E. M. Camacho-Galeano, et al., "Temperature Performance of Sub-1V Ultra-Low Power Current Sources", Department of Electrical Engineering, Federal University of Santa Catarina, Florianópolis, Brazil, 2008.

* cited by examiner

*Primary Examiner* — Ryan Jager (57) ABSTRACT

A low voltage detector (100) includes a voltage and current reference circuit (102); a power supply voltage monitor circuit (104), coupled to the voltage and current reference circuit and to a power supply; and a voltage comparator (106), coupled to the voltage and current reference circuit and to the power supply voltage monitor circuit. The voltage and current reference circuit includes a self-cascode MOSFET structure (SCM) (110) that produces a reference voltage. The power supply voltage monitoring circuit includes another SCM (140) that produces a monitor voltage, related to the power supply voltage. The reference voltage and the monitor voltage have a same behavior with changes in temperature, thereby allowing the trip point of the low voltage detector to minimally vary with temperature. The low voltage detector is disposed on an integrated circuit (101), and the transistors of the low voltage detector consist of only CMOS transistors.

17 Claims, 3 Drawing Sheets

LOW VOLTAGE DETECTOR

BACKGROUND

1. Field

This invention relates generally to low voltage detector circuits and more specifically to a low power consumption, low voltage detector circuit disposed on an integrated circuit and fabricated using a complementary metal oxide semiconductor (CMOS) process.

2. Related Art

Electronic devices frequently employ a voltage detector to indicate if a particular voltage is outside a specified range. For example, battery operated devices often include a voltage detector to provide a low voltage indication when the voltage supplied by the battery decreases below a predetermined level. The low voltage indication can notify the user of the device that the battery should be replaced or recharged. In some electronic devices, it is desirable that a low voltage detector (LVD) have a relatively fine resolution, so that the LVD is able to determine when a monitored voltage is within a narrow range. However, such an LVD (hereinafter "high power LVD") can consume an undesirably large amount of power due to its complexity. A low power consumption, or low power, LVD should have a lowest possible current consumption while also satisfying robustness requirements for its intended application.

A microcontroller unit (MCU) is a single integrated circuit that may include one or more microprocessor cores, and, in some embodiments, random access memory, read-only memory, a clock, an input/output control unit, and one or more LVDs. An LVD may allow an MCU to switch to a known (and safe) state whenever its power supply voltage does not meet a minimum value.

An MCU has at least two operating modes. An MCU has a full power, or run, mode during which time many circuits are operating and, as a result, when in run mode, an MCU may consume maximum power. An MCU may include a high power LVD that operates during run mode. An MCU has a low power, stop, or standby, mode during which time its high power LVD is typically either not operating, or operating intermittently, to save power; however, during which time its low power LVD is typically operating continuously. When either type of LVD detects that the power supply voltage for an MCU is below a minimum value, the LVD sets a flag. Such a flag may force an asynchronous reset of an MCU as a means to prevent the MCU from entering an unpredictable (and consequently undesirable) state, or the flag may generate an interrupt to run a specific subroutine for a low voltage condition. An LVD has a trip point, which is the value of the power supply voltage at which the LVD sets the flag.

In a typical MCU, the trip point of a low power LVD is higher than the trip point of a high power LVD. During either run mode or standby mode, as the power supply voltage drops below the trip point of the low power LVD, the low power LVD sets a flag, generates an interrupt or wakes up the MCU (and may also cause the high power LVD to turn on, if it is not on), and the MCU performs procedures that may be needed prior to powering down, such as by saving information in non-volatile memory. Thereafter, if the power supply voltage drops below the trip point of the high power LVD, then the MCU resets.

High power LVDs usually consume tens to hundreds of microamperes (µA) because they require voltage dividers and bandgap reference voltages to properly operate with high accuracy. When an MCU is powered from a battery, a lower current consumption by a low power LVD results in longer battery life.

Some LVDs disadvantageously use a reference voltage that varies with the threshold voltage ($V_T$) of a metal oxide semiconductor field effect transistor (MOSFET). The threshold voltage of a MOSFET depends upon process and the threshold voltage changes greatly with temperature. When an LVD uses a reference voltage that depends upon threshold voltage, the part-to-part variation of the LVD is disadvantageously great. Therefore, such an LVD is either disadvantageously affected by temperature changes, or it requires additional circuitry that provides temperature compensation but which consumes additional power. Moreover, such an LVD needs trimming to counterbalance the part-to-part variation.

Using the advanced compact model for a MOSFET, the inversion level of a MOSFET transistor is determined by an inversion factor $i_f$, which is defined as $i_f = I/I_s$, where I is the drain current of the transistor, and $I_s$ is the normalization current. The normalization current $I_s$ is equal to $I_{SQ}S$, where $I_{SQ}$ is the sheet specific current that is defined by certain process parameters and S is the aspect ratio of the transistor. The aspect ratio S of a MOSFET transistor is the ratio of channel width W to channel length L. Furthermore, $$I_{SQ} = n\mu C'_{ox}(\Phi_T^2/2)$$

where $\mu$ is the mobility of the carriers in the channel, n is the slope factor, $C'_{ox}$ is the oxide capacitance per unit area of the gate, and $\Phi_T$ is the thermal voltage.

The thermal voltage $\Phi_T$ is a function of temperature and increases directly proportionately with increasing temperature. The thermal voltage $\Phi_T = kT/q$, where T is the temperature measured in kelvins (abbreviated "K", and sometimes informally referred to as "degrees Kelvin"), and q is the magnitude of the electrical charge of an electron ($1.6022 \times 10^{-19}$ coulombs). The Boltzmann's constant, k, can be expressed as $1.3807 \times 10^{-23}$ joules per kelvin. The thermal voltage $\Phi_T$ is approximately 25.85 millivolts at room temperature (approximately 300K). At room temperature, the thermal voltage $\Phi_T$ changes at a rate of approximately 0.0862 millivolts per degree Celsius.

Weak inversion, moderate inversion and strong inversion describe different operational modes of a MOSFET. Weak inversion occurs when a drain current of a MOSFET transistor is dominated by a diffusion current, moderate inversion is when the drain current has both diffusion current and drift current components, and strong inversion is when the drain current is dominated by the drift current. In a MOSFET, inversion occurs when a thinner channel is formed in the transistor in the substrate region under the gate. When there is no channel, the transistor is at cut-off. As a rule of thumb, a MOSFET that has an inversion factor of less than "1" is said to be in weak inversion; a MOSFET that has an inversion factor of about "1" to "100" is said to be in moderate inversion; and a MOSFET that has an inversion factor of greater than "100" is said to be in strong inversion.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
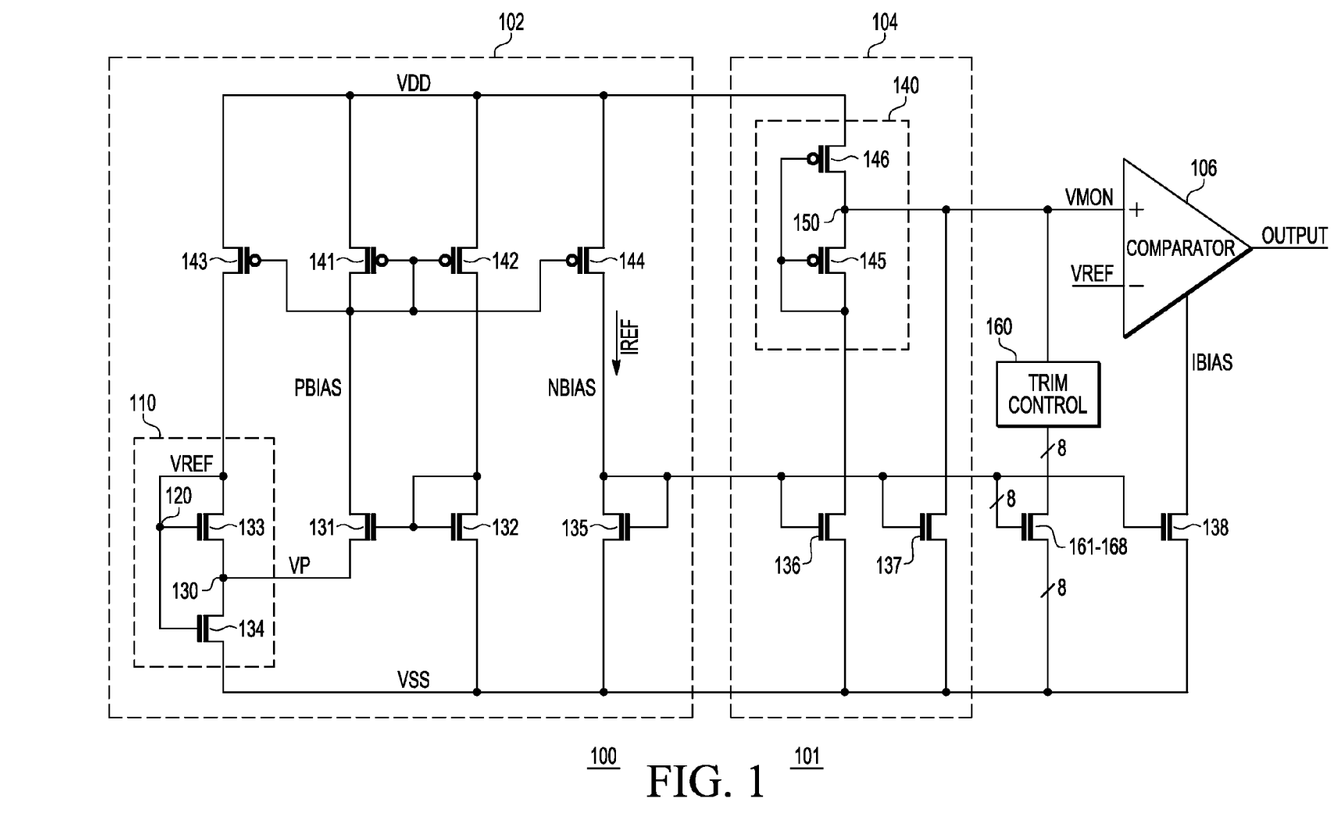
FIG. 1 is a schematic of a low power consumption, CMOS, low voltage detector in accordance with one embodiment of the invention.

FIG. 1 is a schematic of a low power consumption, low voltage detector (LVD) 100 in accordance with one embodiment of the invention, suitable for a microcontroller unit (MCU) and other electronic applications, which delivers a safe operating state even when a minimum power supply voltage specification is violated. The invention allows implementation of a robust LVD 100 that operates with a very low quiescent current during standby mode. In one embodiment, the LVD 100 is disposed on a substrate of an integrated circuit 101. The LVD 100 monitors the power supply voltage $V_{DD}$ of an MCU, and provides a low voltage indication of $V_{DD}$.

In one embodiment, the LVD 100 comprises a voltage and current reference circuit 102, a power supply voltage monitor circuit 104, and a low-power voltage comparator 106.

The voltage and current reference circuit 102 outputs a reference voltage $V_{REF}$, which is, ideally, a fixed DC voltage that does not change with temperature or changes within a limited range, i.e., a few millivolts (mV) above and below a given value. However, in some embodiments of the LVD 100, to save area, complexity and power consumption, $V_{REF}$ is allowed to change over temperature. To reduce circuit complexity and power consumption of the voltage and current reference circuit 102, $V_{REF}$ is not compensated over temperature. As a result, the voltage and current reference circuit 102 produces the reference voltage $V_{REF}$ while consuming very little power.

The LVD 100 also produces a voltage $V_{MON}$, whose value is a fraction of the value of the power supply voltage $V_{DD}$. In various embodiments of the LVD 100, $V_{DD}$ may be a voltage between about 1V to 5V.

The LVD 100 uses an architecture based on self-cascode MOSFETs (SCMs) to achieve reliable, low voltage detection in the nanowatt (nW) power range. An SCM is appropriate for low power applications because it can be biased with a very small amount of current, i.e., in the range of a few nanoamperes (nA). Because an SCM does not include any resistors, the LVD 100 occupies less area on an integrated circuit than the area occupied by other known LVDs.

The voltage and current reference circuit 102 includes a first SCM 110 that comprises two MOSFETs. The first SCM 110 comprises NMOS transistor 133, which is connected in a diode configuration, and NMOS transistor 134, and they are biased such that they operate in moderate inversion mode to save silicon area. In another embodiment, when saving silicon area may not be a primary consideration, the first SCM 110 is configured to operate in moderate to strong inversion mode. NMOS transistor 134 operates in the triode, or linear, region. NMOS transistor 133 operates in the saturation region. The sizes of NMOS transistor 134 and NMOS transistor 133 are selected so that NMOS transistor 134 acts as a large resistor. The voltage and current reference circuit 102 includes an NMOS transistor 131. The source of NMOS transistor 131 is coupled to the first SCM 110. The current flowing through NMOS transistor 134 is equal to the current flowing through NMOS transistor 131 plus the current flowing through NMOS transistor 133. The LVD 100 uses a voltage at a node 120 in the first SCM 110 as the reference voltage $V_{REF}$.

The voltage and current reference circuit 102 includes NMOS transistor 132, which is connected in a diode configuration. The voltage and current reference circuit 102 also includes PMOS transistors 141, 142, 143 and 144. The PMOS transistor 141 is connected in a diode configuration, and PMOS transistor 141 defines the drain current that flows through the drain of PMOS transistors 143, 142 and 144. PMOS transistors 142, 143 and 144 are of a same size and have a mirror ratio of 1:1 with PMOS transistor 141. As a result, the current through each of PMOS transistors 142, 143 and 144 is the same as, or mirrors, the current through PMOS transistor 141. The voltage and current reference circuit 102 includes an NMOS transistor 135. The PMOS transistor 144 generates a current that biases NMOS transistor 135. The voltage and current reference circuit 102 outputs a proportional-to-absolute-temperature (PTAT) reference current $I_{REF}$ at the drain of PMOS transistor 144 that is proportional to the drain current of PMOS transistor 141. The reference current $I_{REF}$ depends on the differential, or delta, of gate voltage ($\Delta V_{GS}$) of NMOS transistor 131 and NMOS transistor 132, which operate in weak inversion mode. The reference current $I_{REF}$ is a PTAT current; however, it would have to change by several orders of magnitude to affect the operation of the LVD 100. In one embodiment, the current through PMOS transistor 141 is 5 nA. In such embodiment, $V_{DD}$ may range between 1.5V to 3.6V and the current $I_{REF}$ will advantageously remain at 5nA, at room temperature.

NMOS transistors 131 and 132 and PMOS transistors 141 and 142 form a self-biasing voltage-following current mirror that applies a PTAT voltage at an intermediate node 130 of the first SCM 110 for a given M:1 size ratio (where M>1) between NMOS transistor 131 and NMOS transistor 132. Hence, there is a close loop gain of greater than one around NMOS transistors 131-132 and PMOS transistors 141-142.

The voltage and current reference circuit 102 biases the other components of the LVD 100, as follows. The NMOS transistor 135 is connected in a diode configuration and NMOS transistor 135 defines the gate voltage of NMOS transistors 136, 137 and 138 and NMOS trimming transistors 161-168. Therefore, the amount of current flowing in each of NMOS transistors 136, 137 and 138 is the same as the amount of current flowing in NMOS transistor 135 if their mirror ratio with respect to NMOS transistor 135 is 1:1. The NMOS transistor 138 supplies a bias current to the comparator 106.

In some known current reference circuits, a resistor is used between the source of NMOS transistor 131 and $V_{SS}$. These circuits are known as $\Delta V_{GS}$ current reference bias circuits. Because transistor 134 in the first SCM 110 of the LVD 100 is operating in the triode region, it replaces the resistor that is employed in such known current reference circuits. Use of the first SCM 110 reduces the area of the integrated circuit 101 compared to using a resistor between the source of NMOS transistor 131 and $V_{SS}$.

The first SCM 110 is employed to achieve a PTAT, resistor-less, self-biased $\Delta V_{GS}$ current reference in the nanoampere range. This current reference generates the reference voltage $V_{REF}$ of the LVD 100. The value of the reference voltage $V_{REF}$ is determined by the parameters of the first SCM 110. From the advance compact model for a MOSFET, a pinch-off voltage of the NMOS transistor 134 ($V_{P134}$) can be expressed as $$V_{P134} = \Phi_T \{\sqrt{1+i_{f134}} - 2 + \ln [\sqrt{1+i_{f134}} - 1]\}$$

where $i_{f134}$ is the inversion factor of the NMOS transistor 134 ($1 < i_{f134} < 100$ to be in moderate to strong inversion).

According to the advance compact model for a MOSFET, the pinch-off voltage $V_{P134}$ of the NMOS transistor 134 can be expressed as $$V_{P134}=(V_{GB134}-V_{T0})/n$$

where $V_{GB134}$ is the gate-to-substrate voltage of the NMOS transistor 134, $V_{T0}$ is the zero-bias threshold voltage of an NMOS transistor, and, again, n is the slope factor. Rearranging the above equation, and taking into account that, for NMOS transistor 134, $V_{GB134}=V_{GS134}$, results in $V_{GS134}=nV_{P134}+V_{T0}$, therefore, $$V_{GS134}=n\Phi_T\{\sqrt{1+i_{f134}}-2+\ln[\sqrt{1+i_{f134}}-1]\}+V_{T0}$$

Because the reference voltage $V_{REF}$ derives from the gate-to-source voltage of the NMOS transistor 134, $V_{REF}$ is given by:

$$V_{REF}(T)=V_{GS134}=n\Phi_T\{\sqrt{1+i_{f134}}-2+\ln[\sqrt{1+i_{f134}}-1]\}+V_{T0} \quad \text{Equation (1)}$$

Note that the value of $\Phi_T$ rises directly proportionally to rising temperature, i.e., $\Phi_T$ exhibits proportional to absolute temperature (PTAT) behavior ($\partial\Phi_T/\partial T=k/q$, or about $8.618\times10^{-5}$ joules per kelvin coulomb). However, the overall variation over temperature of $V_{REF}$ is controlled by the zero-bias threshold voltage of NMOS transistor 134 ($V_{T0}$), which has a well known CTAT variation over temperature. If NMOS transistor 134 is operating in moderate inversion ($1<i_{f134}<100$), the PTAT portion in Equation (1) is in the range of $$126\ \mu V/K < n\Phi_T\{\sqrt{1+i_{f134}}-2+\ln[\sqrt{1+i_{f134}}-1]\} < 884\ \mu V/K,$$

assuming $n\approx1$. Because $V_{REF}$ is mainly determined by the zero-bias threshold voltage, $V_{REF}$ strongly depends on corner process. In a standard CMOS technology, $V_{REF}$ is typically about 500-700 mV.

The first SCM 110 operates in the moderate inversion mode for the following reasons. If the NMOS transistor 134 were to operate in weak inversion, it would not have a linear relation between the drain-to-source voltage ($V_{DS}$) and the drain current. The first SCM 110 requires a linear relation between voltage and current, i.e., the first SCM requires that the NMOS transistor 134 work as a resistor. If the NMOS transistor 134 operates in moderate or strong inversion, it has a linear relation between the drain-to-source voltage and the drain current, i.e., NMOS transistor 134 works as a resistor if the drain-to-source voltage ($V_{DS}$) is smaller than the saturation drain-to-source voltage, ($V_{DSSAT}=V_{GS}-V_T$), where the threshold voltage $V_T$ is given by:

$$V_T=V_{T0}+\gamma\{\sqrt{V_{SB}+2\phi_F}-\sqrt{2\phi_F}\}$$

where $V_{T0}$ is the zero-bias threshold voltage, $\gamma$ is the body-effect constant, $V_{SB}$ is the source-to-substrate voltage, and $\phi_F$ is the Fermi potential. For NMOS transistor 134, $V_{SB}=0$; therefore, $V_T=V_{T0}$.

Note that $V_{DSSAT}$ is normally in the range of 100 mV to 200 mV, depending on the zero-bias threshold voltage. If $V_{AS}$ is larger than $V_{DSSAT}$, the transistor operates in the saturation region, and there is not a linear relation between $V_{DS}$ and the drain current of the transistor.

Moreover, for low power applications, the current flowing through NMOS transistor 134 should be in the range of a few nanoamperes. Therefore, to operate in strong inversion would require a larger size for NMOS transistor 134. Hence, a better trade-off between area and power is attained if NMOS transistor 134 operates in moderate inversion.

The voltage and current reference circuit 102 may include a start-up circuit (not shown in FIG. 1) that ensures that the voltage and current reference circuit starts in a desired state. The voltage and current reference circuit 102 is a simplified version of the circuit described in the published article, TEMPERATURE PERFORMANCE OF SUB-1V ULTRA-LOW POWER CURRENT SOURCES by Camacho-Galeano et al., which is hereby fully incorporated herein.

Even if the value of the portion of $V_{REF}(T)$ within the brackets of Equation (1) is large compared to the value of the threshold voltage, the PTAT variation with temperature of the portion of $V_{REF}(T)$ within the brackets is small compared to the CTAT variation with temperature of the threshold voltage because k/q is small (about $8.618\times10^{-5}$ joules per kelvin coulomb). The PTAT variation with temperature of the portion of $V_{REF}(T)$ within the brackets is, at most, in the range of hundredths of a microvolt per kelvin. On the other hand, the CTAT variation with temperature of the threshold voltage is typically in the range a few millivolts to tens of millivolts per kelvin.

It should be noted that any change in $V_{REF}$ does not depend on $V_{DD}$, because $V_{DD}$ does not appear in Equation (1), which defines $V_{REF}(T)$. As mentioned hereinabove, $V_{REF}(T)$ has CTAT behavior and decreases with temperature. $V_{REF}$ is, by definition, measured with respect to ground, i.e., the same potential to which $V_{DD}$ is referenced. Therefore, in order that a trip point of the LVD 100 does not change with temperature, it is necessary that $V_{MON}$ also have CTAT behavior with respect to ground, or $V_{SS}$.

The power supply voltage monitor circuit 104 is coupled to a terminal of a power supply and monitors the terminal voltage. The power supply voltage monitor circuit 104 includes a second SCM 140 that comprises two FETs. The second SCM 140 comprises PMOS transistor 145, which is connected in a diode configuration, and PMOS transistor 146, and they are biased such that they operate in moderate inversion mode or in strong inversion mode. PMOS transistor 146 operates in the triode, or linear, region. PMOS transistor 145 operates in the saturation region. The sizes of PMOS transistor 146 and PMOS transistor 145 are selected so that the trip point of the LVD 100 meets a specific value or range. $V_{MON}$ is defined as the voltage at a voltage monitor node 150 between the source of PMOS transistor 145 and the drain of PMOS transistor 146.

Because $V_{REF}$ has CTAT behavior, to achieve temperature compensation for the LVD 100, $V_{MON}$ must also have CTAT behavior so that temperature effects on $V_{REF}$ and $V_{MON}$ cancel each other (at least partially) at the inputs of the comparator 106. The CTAT behavior of $V_{MON}$ is ensured by the use of the second SCM 140 in the power supply voltage monitor circuit 104. The PTAT voltage difference between node 150, which is at $V_{MON}$, and a source node of PMOS transistor 146, which is at $V_{DD}$, ensures that $V_{MON}$ has CTAT behavior when referenced to $V_{SS}$. This PTAT voltage difference, with regard to $V_{DD}$, can be expressed as $$V_{DD}-V_{MON}=\Phi_T\left\{\sqrt{1+\alpha i_{r145}}-\sqrt{1+i_{r145}}+\ln\left(\frac{\sqrt{1+\alpha i_{r145}}-1}{\sqrt{1+i_{r145}}-1}\right)\right\} \quad \text{Equation (2)}$$

where $i_{r145}$ is the inversion factor, in reverse saturation, of PMOS transistor 145, and where $$\alpha=\frac{i_{r146}}{i_{r145}}=\left[1+\frac{(W/L)_{145}}{(W/L)_{146}}\cdot\left(1+\frac{1}{N}\right)\right] \quad \text{Equation (3)}$$

where $i_{r146}$ is the inversion factor, in reverse saturation, of PMOS transistor 146, where $(W/L)_{145}$ is the aspect ratio of PMOS transistor 145, where $(W/L)_{146}$ is the aspect ratio of PMOS transistor 146, and where N is the ratio between drain current of NMOS transistor 136 in relation to drain current of NMOS transistor 137 plus the number of NMOS trimming transistors 161-168 that are "turned on" by digital trimming. If NMOS transistors 136 and 137 have a same mirror ratio with respect to NMOS transistor 135, then N=1 in Equation (3).

The voltage $V_{MON}$ is created as follows. The current flowing through PMOS transistor 146 is equal to the current flowing through NMOS transistor 136 plus the current flowing through NMOS transistor 137, and possibly one or more of NMOS trimming transistors 161-168, depending on trimming. The voltage drop between the drain and source of PMOS transistor 146, i.e., the voltage at node 150, can be calculated. The voltage drop across the PMOS transistor 146 depends, inter alia, upon the size of the PMOS transistor 146. The LVD 100 uses the voltage drop across the PMOS transistor 146 to define the trip point of the LVD. Of course, the trip point of the comparator 106 is directly related to the trip point of the LVD 100. The voltage $V_{MON}$ at the node 150 in the second SCM 140 can be calculated because the size of the PMOS transistor 146 and the inversion factors of PMOS transistors 145 and 146 are known. Because the comparator 106 is powered by $V_{DD}$, the voltage drop across the PMOS transistor 146 is made large enough to cause $V_{MON}$ to be sufficiently far from $V_{DD}$ so that the differential pair in the comparator can function properly. The sizes of PMOS transistors 145 and 146 are selected to adjust the trip point of the comparator 106.

Instead of using the second SCM 140, at least one known LVD uses a single transistor connected as a diode, with its gate and drain short-circuited. This single transistor creates a shift between $V_{DD}$ and $V_{MON}$ as a result of the zero-bias threshold voltage of such single transistor. Disadvantageously, an LVD that uses such a single transistor has a trip point that depends greatly on temperature and process.

The voltage $V_{MON}$-$V_{DD}$ is the drain-to-source voltage of PMOS transistor 146. The voltage, from which $V_{MON}$ is measured, is $V_{DD}$, which is also the voltage at the source of PMOS transistor 146. Therefore, the voltage $V_{MON}$ has PTAT behavior with respect to $V_{DD}$ because the thermal voltage $\Phi_T$ increases directly proportionally with increasing temperature. It follows that the voltage $V_{MON}$ has CTAT behavior with respect to ground. As explained hereinabove, $V_{REF}$ has CTAT behavior with respect to ground. Therefore, the size and inversion factor of NMOS transistor 134, which defines $V_{REF}$, is selected in accordance with the selection of the size and inversion factor of PMOS transistors 145 and 146 so that $V_{REF}$ has the same variation with temperature that $V_{MON}$ has.

The inversion factor, in reverse saturation, $i_{r145}$ of PMOS transistor 145 and the parameter a are adjustable. The parameter a depends, inter alia, on the sizes of PMOS transistors 145 and 146. Using Equation (2), the size of PMOS transistor 145 and the size of PMOS transistor 146 are adjusted. By adjusting the sizes of PMOS transistors 145 and 146, a variation over temperature for $V_{MON}$ is attained that is similar to the variation over temperature for $V_{T0}$ of NMOS transistor 134. Consequently, the variation with temperature of the trip point of the LVD 100 is reduced.

$V_{MON}$ is not constant with respect to $V_{DD}$, but $V_{MON}$ has a same behavior with regard to temperature as does $V_{REF}$. Therefore, for a fixed $V_{DD}$, the difference between $V_{REF}$ and $V_{MON}$ is approximately the same over temperature. Consequently, the trip point advantageously remains approximately the same regardless of variations in temperature. In other words, the LVD 100 is compensated over temperature. It is the use of the first SCM 110, which produces $V_{REF}$, and the use of the second SCM 140, which produces $V_{MON}$, that cause $V_{REF}$ and $V_{MON}$ to have a same temperature tendency. Because $V_{REF}$ and $V_{MON}$ have a similar temperature coefficient, the variation of the trip point over temperature is minimized. If the power supply voltage $V_{DD}$ is higher than a minimum value required for the voltage and current reference circuit 102 to operate properly (i.e., one NMOS $V_{T0}$ plus one PMOS $V_{DSSAT}$), then the value of $V_{REF}$ does not change with changes in $V_{DD}$. However, the value of $V_{REF}$ does change with temperature.

The trip point of the comparator 106 occurs when there is a change in sign of the differential voltage at the input of the comparator 106, at which event the output of the comparator changes from "1" to "0", or vice versa. $V_{DD}$ is the voltage that the LVD 100 monitors and detects. $V_{MON}$ is the voltage that the comparator 106 monitors and detects. If $V_{DD}$ is below the trip point of the LVD 100, then the output of the comparator 106 gives a low-voltage flag. For example, if OUTPUT=1, there is no problem with the voltage of the power supply. If OUTPUT=0, the voltage of the power supply is at or below a designed trip point.

In one embodiment of the LVD 100, $V_{DD}$=1.8V and the trip point of the LVD is nominally 1.2V, but varies from about 1V to about 1.4V, depending on temperature and process corners.

As a first example, when the trip point of the LVD 100 is 1V, which is approximately the minimum value of the trip point of the one embodiment of the LVD, and $V_{REF}$=0.7V, which is approximately the maximum value that $V_{REF}$ can be, the comparator 106 changes its output when $V_{MON}$ drops down to 0.7V. In order for $V_{MON}$ to become 0.7V, the voltage drop in the PMOS transistor 146 is 0.3V.

As a second example, when the trip point of the LVD 100 is 1V and $V_{REF}$=0.5V, which is approximately the minimum value that $V_{REF}$ can be, the comparator 106 changes its output when $V_{MON}$ drops down to 0.5V. In order for $V_{MON}$ to become 0.5V, the voltage drop in the PMOS transistor 146 is 0.5V.

As a third example, when the trip point of the LVD 100 is 1.4V, which is approximately the maximum value of the trip point of the same one embodiment, and $V_{REF}$=0.7V, the comparator 106 changes its output when $V_{MON}$ drops down to 0.7V. In order for $V_{MON}$ to become 0.7V, the voltage drop in the PMOS transistor 146 is 0.7V.

As a fourth example, when the trip point of the LVD 100 is 1.4V and $V_{REF}$ is 0.5V, the comparator 106 changes its output when $V_{MON}$ drops down to 0.5V. In order for $V_{MON}$ to become 0.5V, the voltage drop in the PMOS transistor 146 is 0.9V.

The LVD 100, and, in particular, the comparator 106 operate at voltages below the trip point so that the comparator can reliably switch its output when the voltage of their shared power supply is at the voltage of the trip point. For example, if the trip point of the LVD 100 is 1.2V, the LVD must be able to, and does, operate properly when the voltage of the power supply is less than 1.2V, for example, at 1V. Although connections are not shown in FIG. 1, the comparator 106 is also coupled to $V_{DD}$ and $V_{SS}$. The maximum operating voltage of the LVD 100 depends on the technology process of the components of the LVD.

Figure 2:
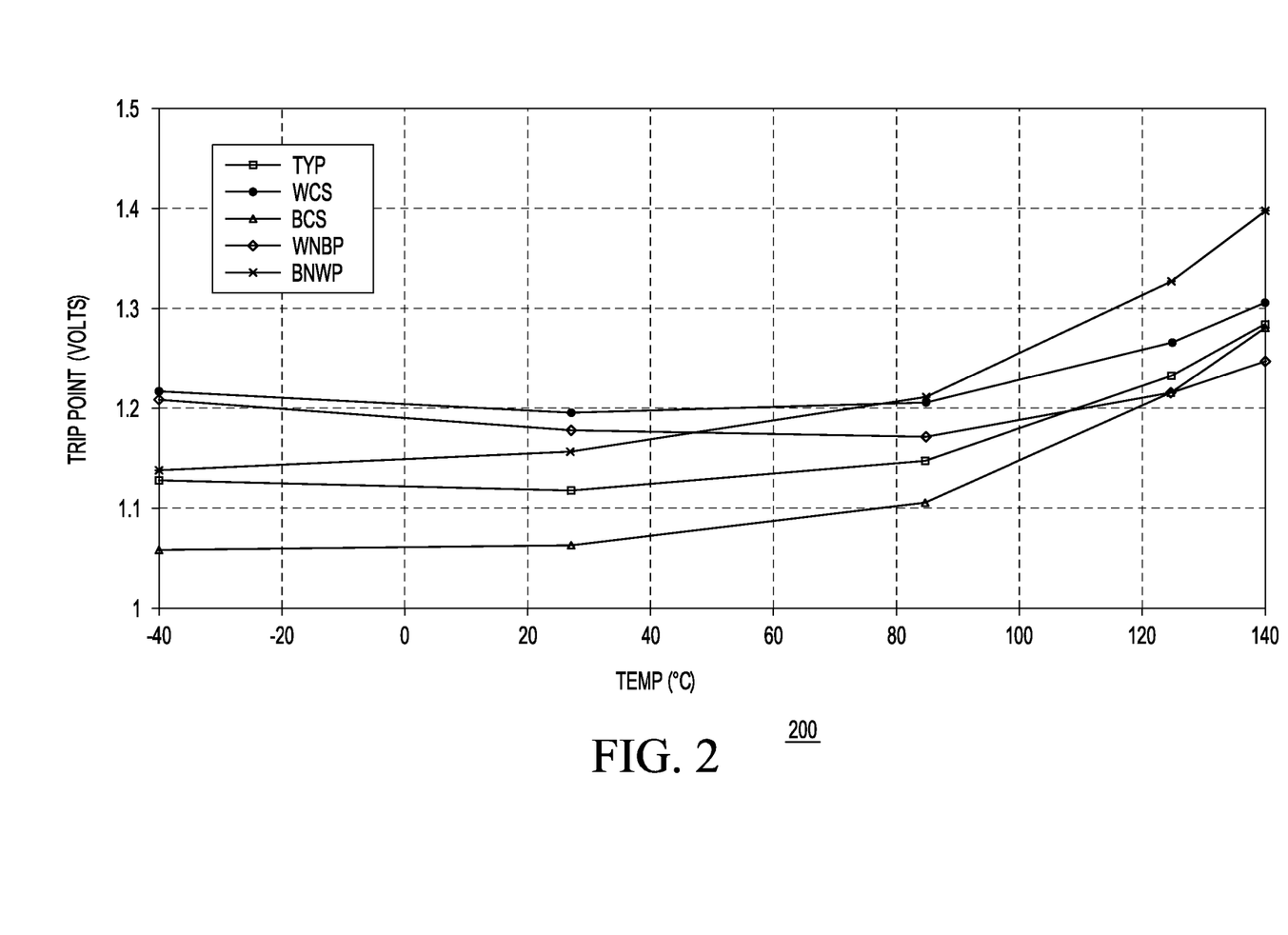
FIG. 2 is a chart of a simulation of operation of the low power consumption, CMOS, low voltage detector shown in FIG. 1.

FIG. 2 is a chart 200 that shows the results of twenty-five (25) simulations of an embodiment of the LVD 100 that has a nominal $V_{DD}$ of 1.8V and a nominal trip point of 1.2V. The chart 200 shows a graph of the trip point of the LVD 100 versus temperature, at five different temperatures between −40° C. and 140° C. and, at each temperature, for five process variation corners: 1) a typical (TYP) case; 2) a worst (WCS) case; 3) a best (BCS) case; 4) a worst NMOS, in which the threshold voltage is higher than nominal, and best PMOS, in which is lower than nominal, (WNBP) case; and 5) a best NMOS and worst PMOS (BNWP) case. The curve for the typical (TYP) case reveals that the trip point of the LVD 100 changes by only about ±5% from −40° C. to about 85° C. with regard to room temperature. The chart 200 indicates that the minimum value of $V_{DD}$ at which the LVD 100 changes its output is 1.058V, and that the maximum value of $V_{DD}$ at which the LVD changes its output is 1.395V. The chart 200 shows that the minimum trip point is 1.058V, which occurs at −40° C. for the BCS case, and that the maximum trip point is 1.395V, which occurs at 140° C. for the BNWP case. The family of curves shown in FIG. 2 reveals that there is only a small variation in the trip point with process.

Figure 3:
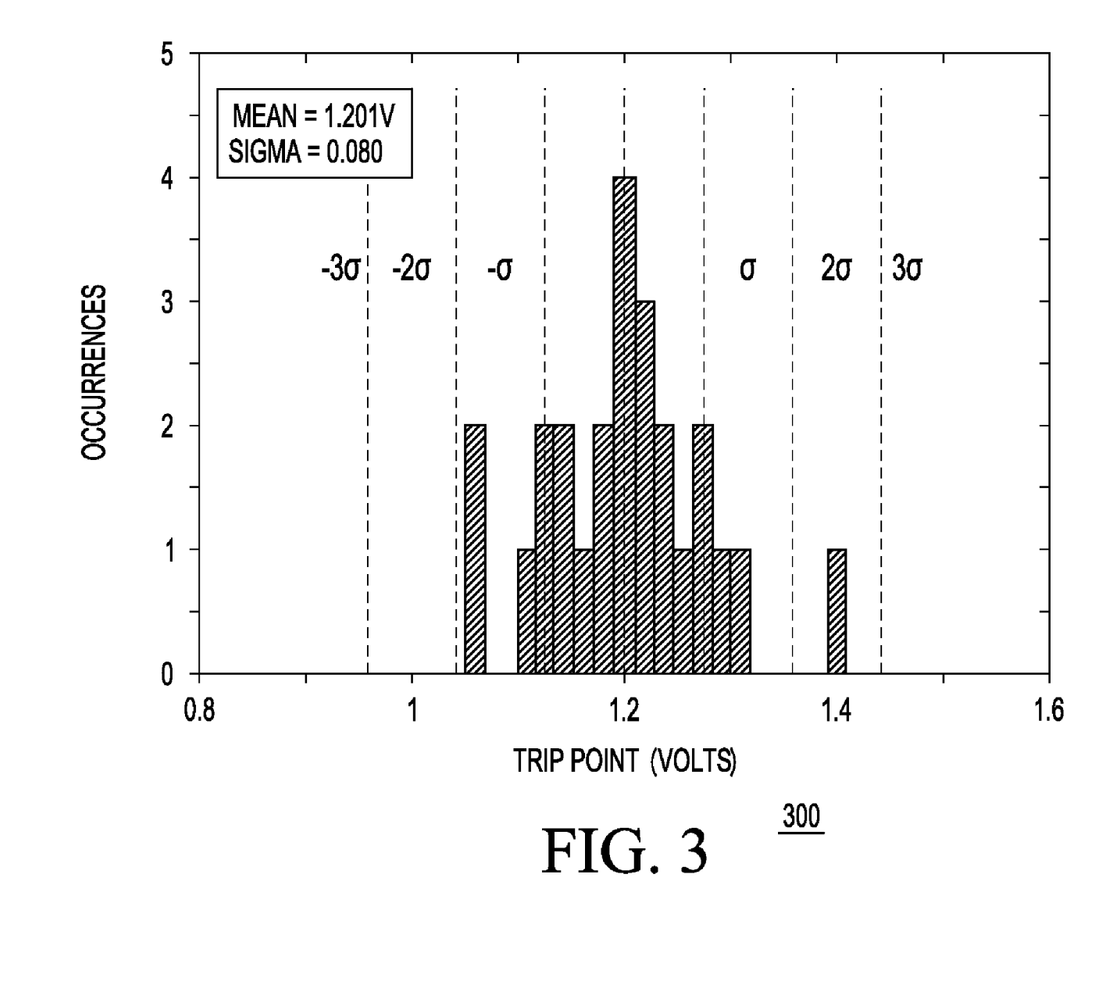
FIG. 3 is another chart of the simulation of operation of the low power consumption, CMOS, low voltage detector shown in FIG. 1.

FIG. 3 is a chart 300 of a bar graph showing frequency of occurrence versus trip point for the same set of simulations that produced the chart 200 of FIG. 2. The chart 300 of FIG. 3 shows that there is advantageously a tight distribution (about ±27%) of the trip point around a mean trip point of 1.201V even with large variations in process.

The LVD 100 further includes an adjustable current mirror circuit to adjust the voltage $V_{MON}$, for fine tuning of the LVD. The adjustable current mirror circuit includes a trim control 160 and a plurality of trimming transistors. In one embodiment, the trim control 160 is an 8-bit digital trim control circuit, and the plurality of trimming transistors comprises eight (8) NMOS trimming transistors 161-168. The trim control 160 is coupled between node 150 of the second SCM 140 and the drain of each NMOS trimming transistor 161-168. The source of each NMOS trimming transistor 161-168 is coupled to ground. The value of $V_{MON}$ is adjusted by the trim control 160 adjusting the current being sunk from node 150 to ground. The current being sunk from node 150 to ground is adjusted by selecting, from the eight (8) NMOS trimming transistors 161-168, a number of NMOS trimming transistors that sinks current from node 150 to ground. The adjustment of the voltage $V_{MON}$ is done by trimming in the following way. Assume that a current mirror ratio from NMOS transistor 135 to NMOS transistors 136 is set to "1", and that a current mirror ratio from NMOS transistor 135 to NMOS transistors 137 is set to "1". The drain current flowing in PMOS transistor 146 is equal to the drain current of NMOS transistor 136 plus the drain current of NMOS transistor 137. The size of each NMOS trimming transistor 161-168 is one-eighth (⅛) the size of NMOS transistor 135, i.e., the W/L of NMOS trimming transistor 161-168 is one-eighth of the W/L of NMOS transistor 135. The trim control 160 selectively switches into node 150 of the second SCM 140 one-eighth of the $I_{DS}$ of NMOS transistor 135 to be selectively sunk from $V_{MON}$ to ground, depending on a value of each bit of a trim <7:0> code. If a bit in the trim <7:0> code is set to "1", the switch is closed and one-eighth of the $I_{DS}$ of NMOS transistor 135 flows from $V_{MON}$ to ground; if the bit is set to "0", the switch is open and no current flows. The trim <7:0> code can be defined from 00000000 to 11111111, so there are eight (8) steps. In one embodiment, the trim <7:0> code is set to 00001111 as a default value, which means that four (4) of the eight (8) NMOS trimming transistors 161-168 are conducting at the default value, and thereby allowing both trimming "up" and trimming "down" from a default trip point. Consequently, the digital trimming of the LVD 100 allows adjustment of the current being sunk from node 150 in steps of one-eighth of the current through NMOS transistor 135. The digital trimming of the LVD 100 allows small changes in drain current of PMOS transistor 146, which directly affects the "N" term in Equation (3). As a consequence, the digital trimming allows small changes in the trip point of the LVD 100 by means of small changes in $V_{MON}$ with regard to $V_{DD}$, while $V_{REF}$ remains unchanged by the trimming.

Advantageously, the LVD 100 uses very low power and compensates well for temperature changes, and the LVD has a low part-to-part variation due to the trimming feature of the invention. Advantageously the LVD 100 does not employ bipolar transistors, resistors, capacitors, an operational amplifier, or any feedback, as do some known LVDs. In one embodiment, all the transistors of the LVD 100 (including the transistors of the comparator 106) consist of only CMOS transistors. The use of only CMOS transistors achieves small silicon area as well as compatibility with standard CMOS technologies, high reusability and low manufacturing cost.

In some embodiments, the invention allows a nanowatt implementation of an LVD. In a worst case simulation, the LVD 100 consumes only 240nA at 1.8V (i.e., 432nW), whereas a typical high power LVD consumes about 5-10 μA at 1.8V (i.e., 91 μW).

In an alternative embodiment of the LVD 100, the source of PMOS transistor 146 is not coupled to $V_{DD}$; instead, the source of PMOS transistor is coupled to another voltage source different from $V_{DD}$. In such alternative embodiment, the LVD 100 monitors the other voltage source for low voltage detection, and does not monitor the voltage $V_{DD}$ of the power supply that powers the LVD.

In one embodiment, the LVD 100 is part of a power management circuit. In another embodiment, the LVD 100 is part of a Power-On Reset (POR) circuit. In one embodiment, the output of the comparator 106 is coupled to a voltage regulator of an MCU.

A System-on-Chip (SoC) includes an MCU and analog and digital peripherals. The LVD 100 may also be used in SoC applications. When using the LVD 100 in a SoC, it is possible to have a plurality of power supply monitors working during standby mode and consuming currents in the range of merely tens of nanoamperes. For example, a SoC may have one LVD 100 having a trip point of 2.6V that monitors the voltage of a 3.3V power supply for analog devices in the MCU system. The same SoC may have another LVD 100 having a trip point of 1.2V that monitors the voltage of a 1.8V power supply for digital devices in the SoC.

Although the invention has been described with respect to specific conductivity types or polarity of potentials, skilled artisans appreciated that conductivity types and polarities of potentials may be reversed.

The specification and figures are to be regarded in an illustrative rather than a restrictive sense, and all such modifications are intended to be included within the scope of the present invention. Any benefits, advantages or solutions to problems described herein with regard to specific embodiments are not intended to be construed as a critical, required or essential feature or element of any or all the claims. Unless stated otherwise, terms such as "first" and "second" are used to arbitrarily distinguish between the elements such terms describe. Thus, these terms are not necessarily intended to indicate temporal or other prioritization of such elements. Note that the term "couple" has been used to denote that one or more additional elements may be interposed between two elements that are coupled.

Although the invention is described herein with reference to specific embodiments, various modifications and changes can be made without departing from the scope of the present invention as set forth in the claims below.

What is claimed is:
1. A low voltage detector, of comprising:
a voltage and current reference circuit for producing a reference voltage $V_{REF}$, wherein the voltage and current reference circuit includes a first self-cascode MOSFET structure (SCM), and wherein the first SCM produces $V_{REF}$;

a power supply voltage monitor circuit, coupled to the voltage and current reference circuit and to a terminal voltage, for monitoring voltage of the terminal voltage and for producing a voltage $V_{MON}$ related to the voltage of the terminal voltage; and a voltage comparator, coupled to the voltage and current reference circuit and to the power supply voltage monitor circuit, for outputting a signal in response to a differential between $V_{REF}$ and $V_{MON}$, wherein the low voltage detector has a trip point, and wherein $V_{REF}$ and $V_{MON}$ have a same behavior with respect to temperature, thereby reducing variation in the trip point with changes in temperature, wherein the power supply voltage monitor circuit includes a second self-cascode MOSFET structure (SCM), wherein the second SCM produces $V_{MON}$, and wherein $V_{MON}$ defines the trip point of the low voltage detector.

2. The low voltage detector of claim 1, in which the first SCM operates in moderate to strong inversion mode.

3. The low voltage detector of claim 1, in which $V_{REF}$ exhibits complementary to absolute temperature (CTAT) behavior.

4. The low voltage detector of claim 1, in which the first SCM includes a first transistor having its drain connected to its gate, and a second transistor having its drain coupled to a source of the first transistor, its gate coupled to the gate of the first transistor and its source coupled to ground potential, wherein a value of $V_{REF}$ is a zero-bias threshold voltage of the second transistor.

5. The low voltage detector of claim 1, in which the first transistor of the first SCM is biased to operate in saturation region and the second transistor of the first SCM is biased to operate in triode region.

6. The low voltage detector of claim 1, in which the second SCM operates in moderate to strong inversion mode.

7. The low voltage detector of claim 1, in which $v_{MON}$ exhibits complementary to absolute temperature (CTAT) behavior.

8. The low voltage detector of claim 1, in which the second SCM includes a first transistor having its drain connected to its gate, and a second transistor having its drain coupled to a source of the first transistor, its gate coupled to the gate of the first transistor and its source coupled to the terminal voltage, and wherein a voltage drop across the second transistor defines a value of $V_{MON}$.

9. The low voltage detector of claim 8, in which the first transistor of the second SCM is biased to operate in saturation region and the second transistor of the second SCM is biased to operate in triode region.

10. A System-on-Chip (SoC), comprising:
a microcontroller unit (MCU), disposed on a substrate of an integrated circuit, and powered by a power supply; and
a low voltage detector, disposed on the substrate of the integrated circuit, coupled to the MCU and to the power supply, the low voltage detector including:
a voltage and current reference circuit for producing a reference voltage $V_{REF}$.
a power supply voltage monitor circuit, coupled to the voltage and current reference circuit, for monitoring voltage of the power supply and for producing a voltage $V_{MON}$ related to the voltage of the power supply, wherein the power supply voltage monitor circuit includes a self-cascode MOSFET structure (SCM), and wherein the SCM produces $V_{MON}$, and
a voltage comparator, coupled to the voltage and current reference circuit and to the power supply voltage monitor circuit, for outputting an output signal in response to a differential between $V_{REF}$ and $V_{MON}$, wherein $V_{REF}$ and $V_{MON}$ have a same behavior with respect to temperature, wherein the low voltage detector has a trip point, and wherein the output signal changes in response to the voltage of the power supply equaling the voltage of the trip point.

11. The SoC of claim 10, in which the SCM includes a first PMOS transistor having its drain connected to its gate, and a second PMOS transistor having its drain coupled to a source of the first PMOS transistor, its gate coupled to the gate of the first PMOS transistor and its source coupled to the terminal voltage, and wherein $v_{MON}$ is defined as voltage at a voltage monitor node between the source of first PMOS transistor and the drain of second PMOS transistor.

12. The SoC of claim 10, including an adjustable current mirror circuit, coupled between the SCM and a ground potential node, for trimming a value of $V_{MON}$ to change the trip point.

13. The SoC of claim 12, in which the value of $V_{MON}$ is trimmed by the adjustable current mirror circuit adjusting current being sunk from the voltage monitor node to the ground potential node.

14. The SoC of claim 13, in which the adjustable current mirror circuit includes:
a trim control, coupled to the voltage monitor node of the SCM; and
a plurality of NMOS trimming transistors coupled to the trim control and to the ground potential node, wherein the value of $V_{MON}$ is adjusted by the trim control coupling either none, one, or more than one NMOS trimming transistors between the voltage monitor node and the ground potential node.

15. An integrated circuit, comprising:
a voltage detector, disposed on a substrate of an integrated circuit, the voltage detector comprising:
a voltage and current reference circuit for producing a reference voltage $V_{REF}$, wherein the voltage and current reference circuit includes a self-cascode MOSFET structure (SCM) that produces $V_{REF}$, wherein $V_{REF}$ exhibits complementary to absolute temperature (CTAT) behavior;
a power supply voltage monitor circuit, coupled to the voltage and current reference circuit and to a power supply, for monitoring voltage of the power supply and for producing a voltage $V_{MON}$ related to the voltage of the power supply, wherein the power supply voltage monitoring circuit includes another SCM that produces $V_{MON}$, wherein $V_{MON}$ exhibits CTAT behavior; and
a voltage comparator, coupled to the voltage and current reference circuit and to the power supply voltage monitor circuit, for outputting an output signal in response to a differential between $V_{REF}$ and $V_{MON}$, wherein the voltage detector has a trip point, and
wherein the output signal changes in response to the voltage of the power supply equaling the voltage of the trip point.

16. The integrated circuit of claim 15, in which the SCM of the voltage and current reference circuit includes a first transistor having its drain connected to its gate, and a second transistor having its drain coupled to a source of the first transistor, its gate coupled to the gate of the first transistor and its source coupled to ground potential, wherein a value of $V_{REF}$ is a zero-bias threshold voltage of the second transistor.

17. The integrated circuit of claim 16, in which the other SCM of the power supply voltage monitor circuit includes a first transistor having its drain connected to its gate, and a second transistor having its drain coupled to a source of the first transistor, its gate coupled to the gate of the first transistor and its source coupled to the terminal voltage, and wherein a voltage drop across the second transistor defines a value of $V_{MON}$.

* * * * *